(12) United States Patent
Hitomi et al.

(10) Patent No.: US 9,200,896 B2
(45) Date of Patent: Dec. 1, 2015

(54) PATTERN DIMENSION MEASUREMENT METHOD AND CHARGED PARTICLE BEAM MICROSCOPE USED IN SAME

(75) Inventors: Keiichiro Hitomi, Delmar, NY (US);
Yoshinori Nakayama, Sayama (JP);
Junichi Tanaka, Hachioji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 786 days.

(21) Appl. No.: 13/504,129

(22) PCT Filed: Sep. 30, 2010

(86) PCT No.: PCT/JP2010/067107
§ 371 (c)(1),
(2), (4) Date: Apr. 25, 2012

(87) PCT Pub. No.: WO2011/052339
PCT Pub. Date: May 5, 2011

(65) Prior Publication Data
US 2012/0212602 A1    Aug. 23, 2012

(30) Foreign Application Priority Data

Oct. 27, 2009  (JP) ................................. 2009-246627

(51) Int. Cl.
*H04N 9/47*    (2006.01)
*H04N 7/18*    (2006.01)
*G01B 15/00*    (2006.01)
*H01J 37/28*    (2006.01)

(52) U.S. Cl.
CPC ................ *G01B 15/00* (2013.01); *H01J 37/28* (2013.01); *H01J 2237/2814* (2013.01); *H01J 2237/2817* (2013.01)

(58) Field of Classification Search
CPC .... G02B 21/365; G02B 21/002; G01B 11/25; G01B 11/2513; G01B 11/026; G01B 11/254; G06T 2207/10061; G06T 2207/10056; G01N 2223/418

USPC ...................... 348/80, 136; 382/145; 250/311
See application file for complete search history.

(56) References Cited

U.S. PATENT DOCUMENTS 6,573,499 B1    6/2003  Sasajima et al.
2005/0221207 A1   10/2005  Nagatomo et al.
(Continued)

FOREIGN PATENT DOCUMENTS

JP    61-265517 A    11/1986
JP    5-060540 A    3/1993
(Continued)

OTHER PUBLICATIONS

J. S. Villarrubia et al., "A Simulation study of Repeatability and Bias in the CD-SEM", Proc. of SPIE vol. 5038, pp. 138-149 (2003).
(Continued)

*Primary Examiner* — Andy Rao
*Assistant Examiner* — Jared Walker
(74) *Attorney, Agent, or Firm* — Miles & Stockbridge PC

(57) ABSTRACT

In order to provide a pattern dimension measurement method with a small measured error and excellent reproducibility even though defocus occurs and a charged particle beam microscope used in the same, in a method for applying a charged particle beam to a specimen formed with a pattern to measure a pattern dimension from a signal intensity distribution of signal charged particles from the specimen, edge index positions (X1) and (X2) on the right and left of the maximum point of signal intensity corresponding to a pattern edge are calculated by a threshold method, and a pattern edge position (Xe) is found from a mean value between the positions. Thus, it is possible to reduce the influence of defocus on the pattern edge position (Xe).

22 Claims, 13 Drawing Sheets

(56) References Cited

U.S. PATENT DOCUMENTS

| | | | |
|---|---|---|---|
| 2005/0281451 A1* | 12/2005 | Starikov | 382/141 |
| 2006/0109486 A1 | 5/2006 | Nitta et al. | |
| 2006/0245636 A1* | 11/2006 | Kitamura et al. | 382/149 |
| 2007/0029478 A1* | 2/2007 | Sato et al. | 250/310 |
| 2007/0092130 A1 | 4/2007 | Shishido et al. | |
| 2007/0286494 A1* | 12/2007 | Shishido et al. | 382/207 |
| 2009/0212212 A1 | 8/2009 | Shishido et al. | |
| 2009/0212215 A1* | 8/2009 | Nagatomo et al. | 250/311 |
| 2009/0242760 A1 | 10/2009 | Miyamoto et al. | |

FOREIGN PATENT DOCUMENTS

| | | |
|---|---|---|
| JP | 11-237231 A | 8/1999 |
| JP | 2001-147113 A | 5/2001 |
| JP | 2005-286095 A | 10/2005 |
| JP | 2006-170969 A | 6/2006 |
| JP | 2007-019523 A | 1/2007 |
| JP | 2007-120968 A | 5/2007 |
| JP | 2009-198338 A | 9/2009 |
| JP | 2009-243993 A | 10/2009 |

OTHER PUBLICATIONS

Office Action issued May 7, 2013, in Japanese Patent Application No. 2011-538320.

International Search Report issued Nov. 2, 2010, in International Application PCT/JP2010/067107 (WO 2011/052339 A1).

* cited by examiner

RADIAL DIRECTION POSITION FROM
HOLE-PATTERN CENTER (nm)

PATTERN DIMENSION MEASUREMENT METHOD AND CHARGED PARTICLE BEAM MICROSCOPE USED IN SAME

TECHNICAL FIELD

The present invention relates to a pattern dimension measurement method and a charged particle beam microscope used in the same.

BACKGROUND ART

The performance of semiconductor devices has been improved mainly because of the downscaling of circuit patterns. Since the dimensions and shapes of fine patterns greatly affect the performance of devices, it is necessary to perform inspection highly accurately in high resolution. Therefore, at the manufacturing sites of semiconductor devices, a critical dimension scanning electron microscope (CD-SEM) is used for pattern inspection.

The CD-SEM applies a narrowly focused electron beam onto a specimen, and calculates the dimensions and shapes of a pattern formed on the specimen from the intensity distribution of backscattered electrons or secondary electrons emitted from the applied location for determining whether the pattern is good or bad.

FIGS. 1A to 1C are diagrams for explaining the detection of pattern edge positions. FIG. 1A illustrates the cross sectional topology of a line pattern, FIG. 1B illustrates a schematic diagram depicting an image obtained when observing this line pattern using a CD-SEM, and FIG. 1C illustrates a signal intensity distribution. Since the amount of secondary electrons emitted is increased at pattern edge portions, which is called edge effect, a band-like region called a white band is observed at a location corresponding to a pattern edge portion in an image obtained by the CD-SEM (two white vertical lines in FIG. 1B). This white band is used for detecting a pattern edge position.

There are proposed various signal processing algorithms for identifying pattern edge positions, and which algorithm is used for detecting edge positions is decided mainly by a user. For exemplary edge detection algorithms, Patent Literature 1 discloses a waveform matching method, and Non-Patent Literature 1 discloses a function fitting method or the like.

Moreover, a signal intensity waveform is used not only for detecting edges but also for estimating the cross sectional topology of a pattern as described in Patent Literature 2. Furthermore, Patent Literature 3 describes an automatic determination method for false dimension measurement due to defocus from the slope of a signal intensity distribution.

CITATION LIST

Patent Literature

Patent Literature 1: Japanese Patent Application Laid-Open Publication No. 2007-120968
Patent Literature 2: Japanese Patent Application Laid-Open Publication No. 2005-286095
Patent Literature 3: Japanese Patent Application Laid-Open Publication No. 2006-170969

Non-Patent Literature

Non-Patent Literature 1: J. S. Villarrubia, A. E. Vladar, and T. Postek, "A Simulation Study of Repeatability and Bias in the CD-SEM" Proc. SPIE 5038, pp. 138-149 (2003).

SUMMARY OF INVENTION

Technical Problem

In the situations that the downscaling of patterns advances and high resolution is demanded, the width dimension of a line pattern in a height of 100 nm and a width of 55 nm was measured using a threshold method. FIG. 2 illustrates the cross sectional topology and signal intensity distribution of a pattern edge portion. The pattern edge illustrated in FIG. 2 is the right edge of a line pattern. FIG. 2 reveals that the signal intensity is large near the pattern top and the signal value is reduced at a lower position of the pattern. Although which height of a pattern to be measured depends on a user, the signal intensity distribution on the right side of the peak is more important for edge detection regardless of which height is to be measured. In various signal processing algorithms, signals in this portion are processed for edge detection.

For an exemplary signal processing algorithm, the threshold method will be explained with reference to FIG. 3. The threshold method is a signal processing algorithm in which the minimum intensity and maximum intensity of white bands corresponding to the right and left edges are found from a signal waveform, the intensity of a threshold to internally divide the minimum intensity and the maximum intensity in a predetermined ratio is calculated, a position at which the signal waveform matched with the threshold intensity is defined as an edge position, and a distance between the right and left edge positions is considered to be a dimension.

The width dimension of the line pattern in the aforementioned dimensions (a height of 100 nm and a width 55 nm) was measured at a plurality of times, and it was revealed that the reproducibility of the result of the pattern dimension measurement cannot be sometimes obtained. Moreover, as a result of investigating factors of errors in pattern dimension measurement using a CD-SEM, it was revealed that a main factor is the defocus of an applied electron beam.

As described above, the CD-SEM applies a narrowly focused electron beam, and detects the intensity distribution of backscattered electrons or secondary electrons emitted from the applied location. In the case where the applied electron beam is not narrowly focused on the surface of a specimen to be observed, that is, defocus occurs, spatial resolution deteriorates to form a blurred image. This deterioration in spatial resolution not only makes the observation of a fine pattern difficult but also affects pattern dimensions.

FIGS. 4A and 4B illustrate a change between CD-SEM images and a change between signal intensity distributions when varying the focal point of an electron beam applied to a specimen. It can be confirmed that if the focal point is shifted from the surface of the specimen, the signal intensity distribution spreads and white bands are widened. If white bands spread, a shift in the edge position occurs as illustrated in FIG. 4B even in the case where the same pattern is measured.

FIGS. 4A and 4B illustrate the results of edge detection using the threshold method for an edge detection algorithm. However, since a function is applied to a waveform on the right side of the maximum point of signal intensity also in the function fitting method illustrated in Non-Patent Literature 1, a shift in the edge position occurs as similar to FIGS. 4A and 4B. In other words, it is shown that the focal point of the applied electron beam is merely changed to cause a change in pattern dimensions even though the dimensions and shapes of the pattern are not changed.

Moreover, in Patent Literature 1, since a reference waveform acquired beforehand is checked against a measured waveform, a shift in the edge position described above does not occur. However, it is predicted that if a focus value is different between the reference waveform and the measured waveform, the accuracy of checking the waveforms deteriorates to cause a large measured error.

Generally, in the CD-SEM, the focal point is adjusted automatically or manually before acquiring an image of a measurement subject pattern. Adjusting the focal point is a method in which an image is acquired while changing a focal point on a measurement subject pattern or on a pattern existing near a measurement subject pattern and a position at which the sharpest image is acquired is a focal point.

However, the focal point is sometimes changed because of the influence of charge up of an insulating material existing in a circuit pattern, mechanical vibrations, or electric noise.

Patent Literature 3 discloses a technique that compares a tapered width (for example, a width between the maximum peak value and the minimum peak value corresponding to the edge portion of a signal intensity distribution) with a preset reference value in order to automatically determine the measurement failure of the line width or the like of a pattern caused by the fuzziness of an image due to failure in adjusting the focal point (defocus) when shooting the image or an image drift due to charge up. However, Patent Literature 3 is a technique to automatically determine measurement failure, and does not describe a technique to reduce measured errors.

Moreover, as described in Patent Literature 2, the white band includes the components of a pattern shape. The method described in Patent Literature 3 does not distinguish between defocus and a change in a pattern shape, and it is likely that a measurement result is determined as failure depending on a pattern shape even in the case where defocus does not occur. As an example, FIGS. 5A and 5B illustrate CD-SEM images and signal intensity distributions in measuring two patterns with the same pattern top dimension and different side-wall angles using a CD-SEM. As illustrated in the signal intensity distributions, it is revealed that a change is not observed much in the waveform on the left side when seen from the maximum point of signal intensity whereas the waveform spreads largely on the right side. Furthermore, it is shown that the gradient is gentler on the right side as the side-wall angle is larger and the spread is not distinguished from defocus illustrated in FIG. 4B only by the gradient of the signal intensity distribution.

In addition, Patent Literature 2 does not take the influence of defocus described in Patent Literature 3 into account, and also does not distinguish between defocus and a change in a pattern shape.

Namely, Patent Literature 2 does not distinguish between a pattern dimension value obtained through the CD-SEM truly reflecting the dimensions and shapes of the pattern and a pattern dimension value obtained through the CD-SEM reflecting a change in the focal point of the electron beam applied by the CD-SEM, causing deterioration in measuring accuracy due to a change in the focal point.

As described above, there are not any edge detection algorithms and pattern dimension measurement methods so far that are stable against defocus and sensitive to changes in pattern dimensions or shapes.

It is an object of the present invention to provide a pattern dimension measurement method with a small measured error and an excellent reproducibility even though defocus occurs and a charged particle microscope for use in the same.

Solution to Problem

A form for achieving the aforementioned object is a pattern dimension measurement method for applying a charged particle beam to a specimen formed with a pattern to measure a pattern dimension from a signal intensity distribution of backscattered charged particles or secondary charged particles generated from the specimen, the method including: calculating a first maximum point of intensity at which the signal intensity becomes a maximum intensity at a location corresponding to a first edge of a pattern to be measured; finding a first edge index position A and a first edge index position B on a far side and a close side from another second edge of the pattern to be measured as the first maximum point of intensity is at a center; and finding the first edge position of pattern to be measured using the first edge index position A and the first edge index position B.

Moreover, a charged particle beam microscope includes: a charged particle optical system including: a stage; and a detector configured to apply a charged particle beam to an observation region of a specimen placed on the stage while scanning the charged particle beam, and detect signal charged particles including backscattered charged particles or secondary charged particles generated from the specimen; an operating unit including: a unit configured to acquire a two-dimensional image of a pattern to be a dimension measurement subject placed in the observation region using information about a waveform of signal intensity of the signal charged particles detected at the detector; and a unit configured to measure a dimension of the pattern in the observation region by detecting an edge position of the pattern using the two-dimensional image; and a display unit, wherein: the operating unit includes: a first functionality (a signal intensity maximum point calculating unit, for example) to calculate a first maximum point of intensity at which the signal intensity becomes a maximum intensity at a location corresponding to a first edge of a pattern to be measured; a second functionality (an edge index position calculating unit, for example) to calculate a first edge index position A and a first edge index position B on a far side and a close side from another second edge of the pattern to be measured as the first maximum point of intensity is at a center; and a third functionality (an edge position calculating unit, for example) to calculate the first pattern edge position using the first edge index position A and the first edge index position B; and the display unit displays a result of calculating the first pattern edge position.

Advantageous Effects of Invention

With the aforementioned configuration, it is possible to provide a pattern dimension measurement method with a small measured error and an excellent reproducibility even though defocus occurs and a charged particle microscope for use in the same.

BRIEF DESCRIPTION OF DRAWINGS

FIG. 15 show illustrations for pattern edge detection according to a maximum gradient method.

DESCRIPTION OF EMBODIMENTS

Figure 4A:
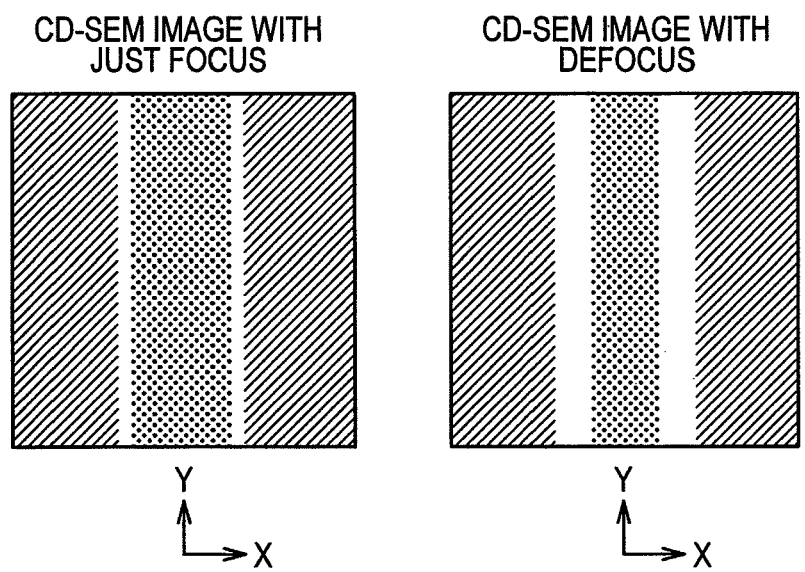
FIG. 4A shows plan views illustrating a change between images depending on the presence or absence of defocus.
Figure 4B:
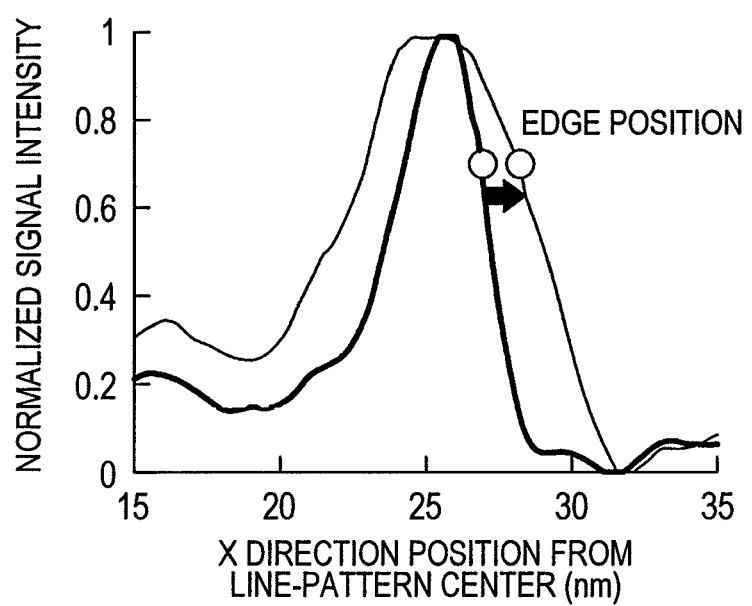
FIG. 4B is a diagram illustrating a change between signal intensity distributions depending on the presence or absence of defocus.

As illustrated in FIG. 4B, a shift in the focal point causes the signal intensity distribution to change so as to laterally spread as the maximum point of signal intensity is at the center. Therefore, in this embodiment, a plurality of edge index positions are found at lateral positions as the maximum point of signal intensity is at the center using a predetermined algorithm, and the edge index positions are averaged, thereby suppressing fluctuations in a critical dimension value due to fluctuations in the focal point. The algorithm in calculating a plurality of edge index positions is not limited to one algorithm because of optimization in which a change in the signal intensity distribution due to defocus can be cancelled, and the algorithm can be changed at every position for edge detection.

Moreover, in this embodiment, in the case where the white band width is widened beyond a set value, a possibility can be considered that the focal point is shifted from the surface of a specimen. Therefore, the focal point is again adjusted to acquire an image of a measurement subject pattern.

For methods other than the method according to this embodiment, the detection of the maximum point of signal intensity is named. As revealed from FIG. 4B, the maximum point of signal intensity exists at almost a constant position even though a change in the focal point occurs. Thus, such a signal processing algorithm is used in which a threshold of 100% is specified using a threshold method, for example, so as to detect the maximum point of signal intensity, whereby a stable measurement can be performed against a change in the focal point.

Figure 1A:
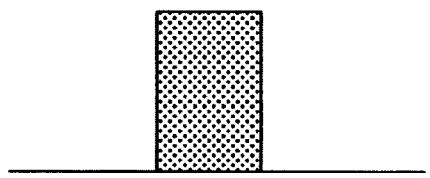
FIG. 1A is a cross sectional view illustrating an inspection pattern for explaining the detection of pattern edge positions.
Figure 1B:
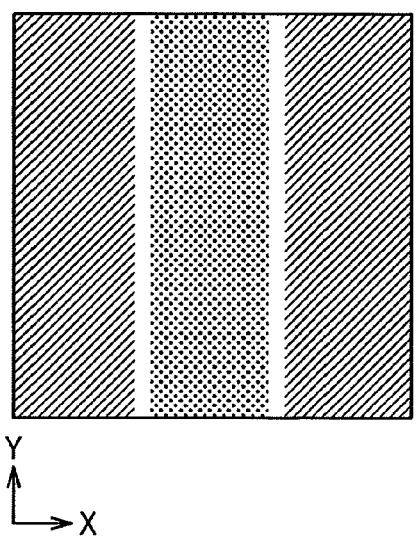
FIG. 1B is a plan view illustrating an inspection image (a schematic diagram) using a CD-SEM for explaining the detection of pattern edge positions.
Figure 1C:
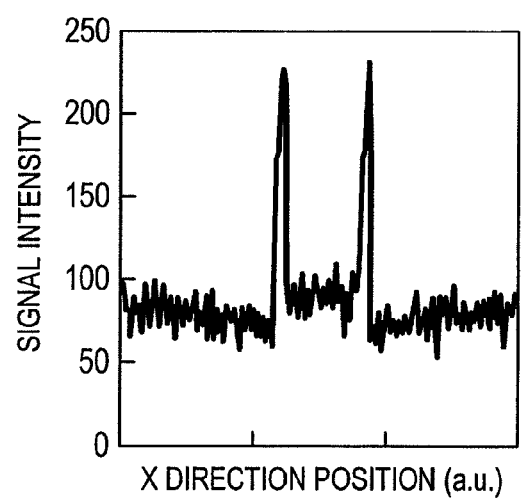
FIG. 1C is a diagram illustrating a signal intensity waveform for explaining the detection of pattern edge positions.

However, as illustrated in FIG. 1C, random noise is superimposed on the signal intensity waveform of the CD-SEM, and an image with a poor signal-to-noise ratio is often used. Because of the influence of random noise, an error occurs in a pattern dimension value obtained by the CD-SEM. For example, since the signal intensity distribution when defocus occurs in FIG. 4B has a flat distribution near the maximum point of signal intensity in a range of about 5 nm, it is likely that the edge detection position is shifted about 5 nm due to the influence of random noise if the edge is detected at a threshold of 100%. In other words, although the detection of the maximum point of signal intensity at a threshold of 100% or the like can suppress fluctuations in the edge position caused by fluctuations in the white band width, fluctuations in the edge position due to random noise become noticeable.

In this embodiment, attention was focused on a change in the white band width due to defocus that changes so as to laterally spread as the maximum point of signal intensity is at the center.

According to this embodiment, it was possible to suppress fluctuations in the critical dimension value in association with a change in the white band width caused by a shift in the focal point of or the like, and to improve the accuracy of measuring pattern dimensions.

Moreover, deterioration in measuring accuracy occurs in the method for detecting the maximum point of signal intensity due to the influence of random noise. However, in this embodiment, since two edge index positions can be used, which do not tend to be affected by random noise, deterioration in the accuracy of measuring pattern dimensions caused by random noise does not occur.

In the following, more detailed description will be given with reference to embodiments.

First Embodiment

Figure 6:
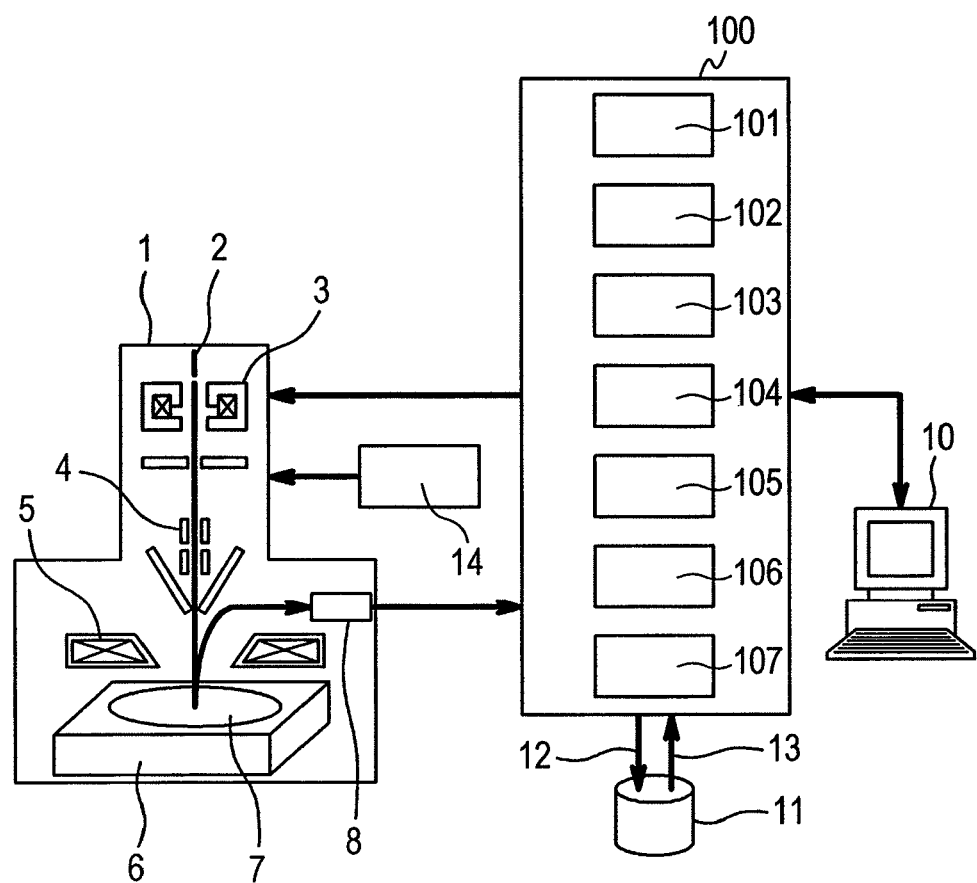
FIG. 6 is a diagram illustrating the schematic configuration of a CD-SEM according to a first embodiment.

A first embodiment will be described in detail with reference to the drawings. In this embodiment, an electron microscope (a CD-SEM) is taken as an example for a pattern inspection apparatus for semiconductor devices. FIG. 6 is a diagram illustrating the schematic configuration of a CD-SEM according to this embodiment. The measurement principle of this CD-SEM will be described with reference to FIG. 6. The CD-SEM according to this embodiment includes an electron source 2 that emits electrons, a converging lens 3 that converges an electron beam generated from the electron source 2, a deflector 4 that deflects the electron beam, an objective lens 5 that converges the electron beam to form a minimum spot on a specimen, a stage 6 that places an observation specimen (a wafer for a measurement subject) 7 thereon and moves to an observation region, an electron optical system 1 including a detector 8 that detects secondary electrons or backscattered electrons generated from the specimen, an operating unit 100 that processes obtained signal waveforms and measures pattern dimensions, a display unit 10 that receives input from an operator for displaying images of the scanning electron microscope, a storage unit 11 that stores data in the past, and an electron optical system control unit 14 that reflects the conditions of applying the electron beam in the electron optical system 1 and controls the electron optical system 1. A reference numeral 12 in FIG. 6 denotes a flow such as a flow to save measurement results, acquired images, or the like in the storage unit, and a reference numeral 13 denotes a flow such as a flow to load data stored in the storage unit.

The operating unit 100 includes a signal intensity maximum point calculating unit 101, an edge index position calculating unit 102, an edge position calculating unit 103, a threshold setting unit 104, a defocus value calculating unit 105, an edge position correction operating unit 106, and a hole pattern signal intensity distribution calculating unit 107.

An automatic pattern dimension inspection method using the CD-SEM will be described in detail with reference to a flow chart illustrated in FIG. 7. First, measurement is started in Step S7001. Subsequently, a specimen for a measurement subject is transferred into a vacuum chamber in Step S7002. In this embodiment, a specimen formed with a resist pattern was used. Although this method is preferably used for the resist pattern, the method is also applicable to other materials.

The stage is moved in Step S7003, and a measurement location is moved in the application range of an electron beam. An SEM image is acquired at a magnification of about ten thousands in Step S7004. This SEM image is matched with a template image registered beforehand, whereby the measurement position is accurately adjusted (Step S7005).

Subsequently, the focal point is adjusted using a measurement subject pattern or a pattern existing near a measurement subject pattern in Step S7006. An SEM image of the measurement subject pattern is acquired at a magnification of hundred thousands or more in Step S7007, and the acquired image is stored in the storage unit 11.

Edges are detected from the SEM images obtained in Steps S7008 to S7015 by a predetermined edge detection algorithm. The detail of Steps S7008 to S7015 will be described later.

A defocus index value (a measurement error Xf) is calculated from the SEM images in Step S7013. In the case where it is likely that defocus occurs, the process returns to Step S7006. The focal point is adjusted, and then the same location is again measured. In this processing, the display unit 10 displays a warning about defocus.

In the case where defocus does not occur in Step S7014, the process goes to Step S7016, and it is determined whether measurements are all finished. In the case where any measurement point is left, measurement is moved to the subsequent measurement point in Step S7003 for measurement. In the case where no measurement point is left in Step S7016, the process goes to Step S7017 to end measurement.

The aforementioned flow is a flow in the case of operating the automatic inspection sequence registered beforehand in the CD-SEM. However, the flow is not limited thereto, and the flow is also applicable to the case of manual inspection.

Subsequently, the edge detection algorithm stable against fluctuations in signal intensity waveforms for use in Steps S7008 to S7015 in FIG. 7 will be described in detail.

When the focal point of the CD-SEM fluctuates, the signal intensity waveform spreads as illustrated in FIG. 4B, and the white band width corresponding to the pattern edge portion is widened (FIG. 4A), which is previously described. This is caused by the fact that the spot diameter of the electron beam applied to the specimen is increased.

When the spot diameter of the electron beam applied to the specimen is increased, the end of the electron beam spot hits the pattern edge portion even though the electron beam is applied to a location apart from the edge, and the amount of secondary electrons emitted is increased because of the aforementioned edge effect. Consequently, the white band looks wider than in applying a beam with a smaller spot diameter.

The spread of the white band width described above occurs on both sides as the maximum point of signal intensity is at the center. In other words, in the case where the right edge portion of the line pattern illustrated in FIG. 4A is taken as an example, the waveform spreads in the right direction on the right side of the maximum point of signal intensity, whereas the waveform spreads in the left direction on the left side of the maximum point of signal intensity.

The signal waveform spreads in the opposite directions on the right side and the left side as the maximum point of signal intensity is at the center. Thus, the edge index positions are detected on both sides, and the edge index positions are averaged to cancel fluctuations in the dimension values due to waveform fluctuations, whereby highly accurate pattern dimension inspection can be performed.

Figure 5A:
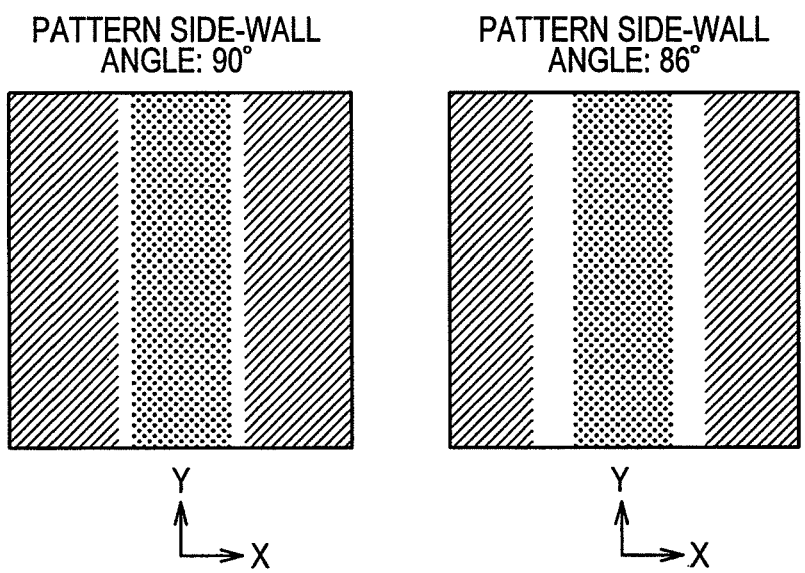
FIG. 5A shows plan views illustrating a change between images due to a change between pattern side-wall angles.
Figure 5B:
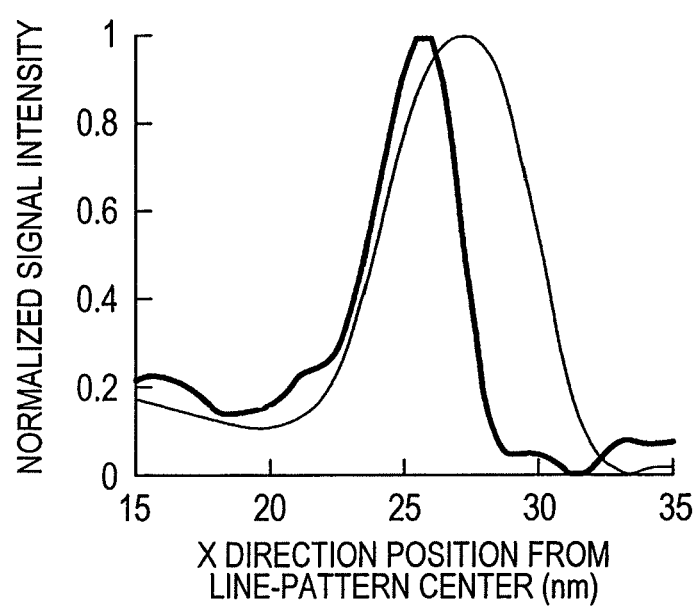
FIG. 5B is a diagram illustrating a change between signal intensity distributions due to a change between pattern side-wall angles.

FIG. 5B illustrates a change between signal intensity waveforms when the pattern shape is changed while the focal point is made constant. FIG. 5A shows schematic diagrams illustrating SEM images acquired from two types of specimen shapes at a side-wall angle of 90 degrees and a side-wall angle of 86 degrees. It is noted that the dimensions of the pattern height and the pattern top are the same in two types of shapes, and only the side-wall angles are different.

As illustrated in FIG. 5B, when a pattern shape variation is changed, the waveform on the left side is not changed so much when seen from the maximum point of signal intensity, but a large change occurs in the waveform on the right side. This is because the waveform on the left side reflects the shape of the pattern top and the waveform on the right side reflects the shape of the pattern tail portion. The dimension to be measured in a pattern, which the side wall has a slope, is the dimension of the tail portion of the pattern. Sensitivity to a pattern shape variation is not impaired even in the case of using the method according to this embodiment because of the asymmetry of lateral fluctuations in signal intensity waveforms, so that pattern dimensions can be measured.

The detection of the edge index position will be described in detail with reference to the flow chart for Steps S7008 to S7015 in FIG. 7. First, an edge detection algorithm is specified in Step S7008. In Step S7008, parameters for the edge detection algorithm are set using a GUI illustrated in FIG. 8.

Figure 8:
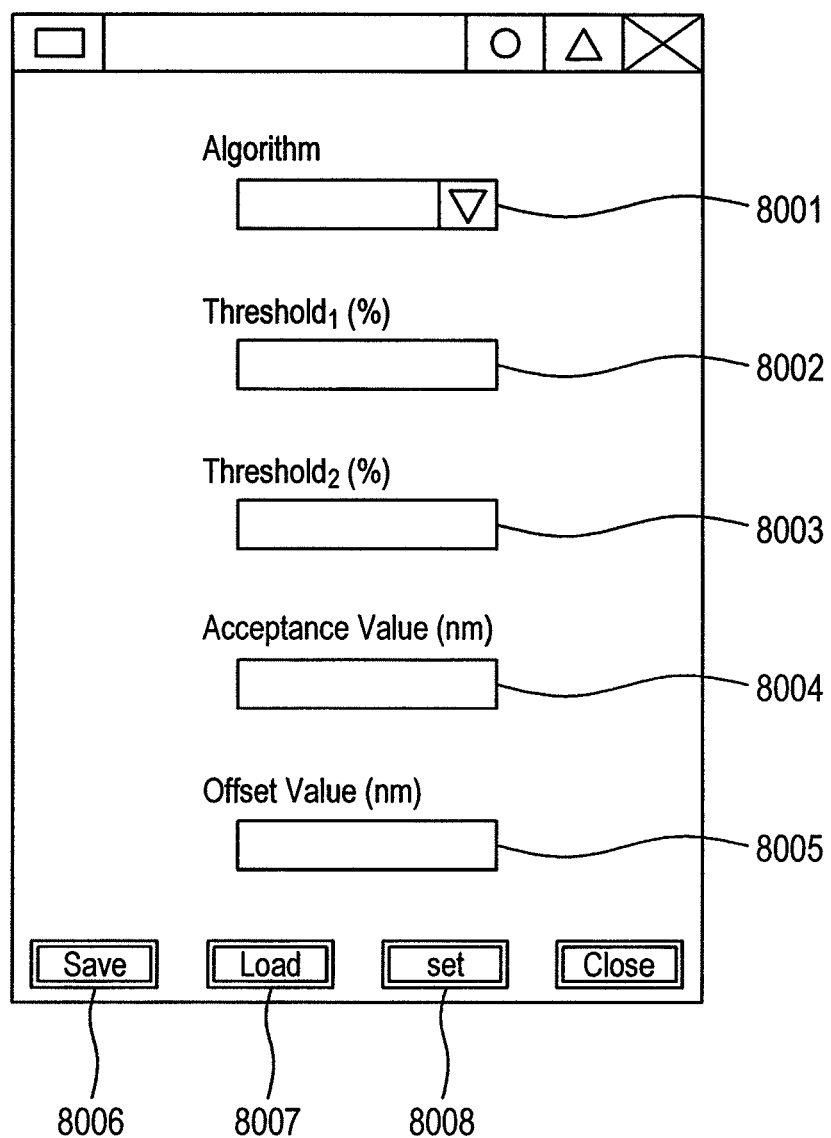
FIG. 8 is a diagram illustrating a GUI for setting parameters in the CD-SEM according to the first embodiment.

A reference numeral 8001 in FIG. 8 denotes a select frame for edge detection algorithms registered beforehand. In this embodiment, the case is described where the threshold method is selected for the edge detection algorithm. However, this embodiment is effective even in the case of using other edge detection algorithms such as the maximum gradient method and the straight-line approximation method. It is noted that the maximum gradient method and the straight-line approximation method will be described later.

Figure 7:
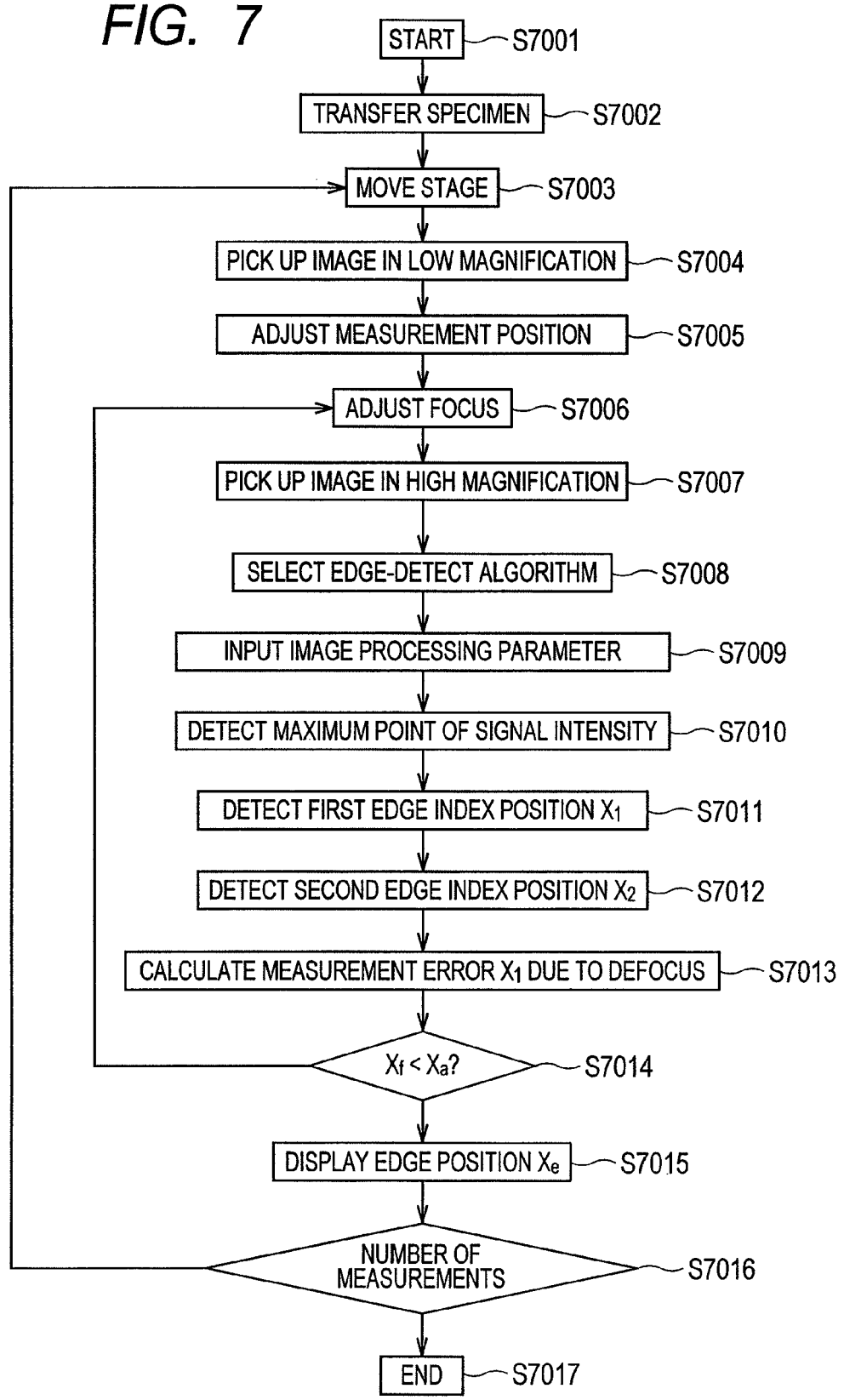
FIG. 7 is a measurement flowchart according to the first embodiment.

In Step S7009 in FIG. 7, the parameters used in the edge detection algorithm selected in Step S7008 are inputted using the GUI illustrated in FIG. 8.

In the case of selecting the threshold method for the edge detection algorithm, the following input is made. A threshold to detect the first edge index position shown in Step S7011 in FIG. 7 is inputted to a first threshold input frame 8002. A threshold to detect the second edge index position shown in Step S7012 in FIG. 7 is inputted to a second threshold input frame 8003. A measurement error acceptance value Xa due to defocus is inputted to an input frame 8004, and an edge position correction value is inputted to an input frame 8005. It is noted that the offset value will be described later. After inputting all the parameters, a parameter setting button 8008 is pressed to set the parameters to the operating unit.

The set parameter settings are saved in the storage unit 11 by pressing a save button 8006. Moreover, the parameters saved in the past are loaded from the storage unit 11 by pressing a load button 8007.

Subsequently, the maximum point of intensity of the obtained waveform is calculated in Step S7010.

Figure 9:
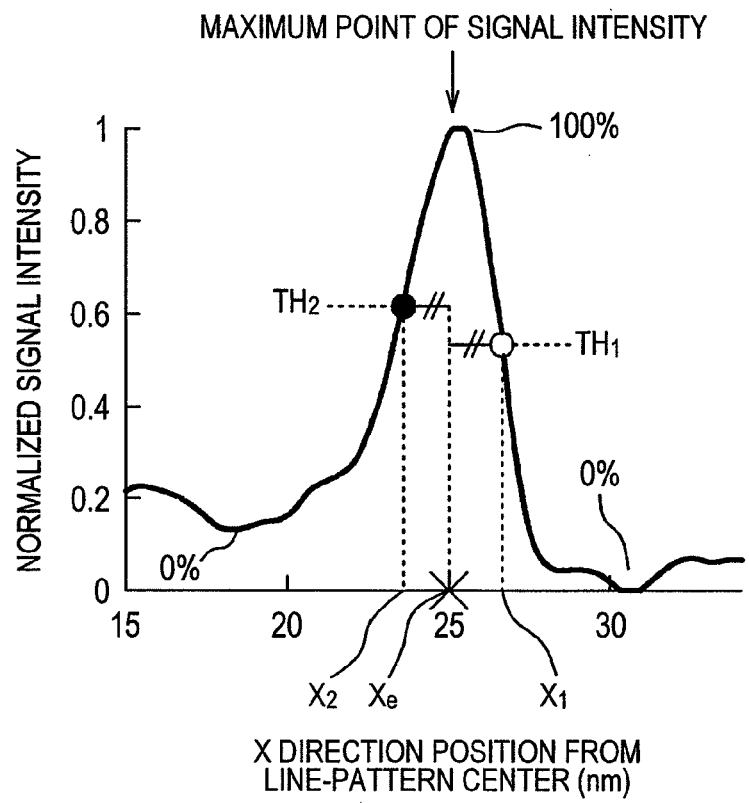
FIG. 9 is a schematic diagram for explaining an edge detection method according to the first embodiment.

The parameters thus set are used for detecting the edges of the pattern. Edge detection according to this embodiment will be described with reference to FIG. 9. An edge shown in FIG. 9 corresponds to the right edge of a line pattern. First, the maximum point of intensity of the obtained waveform is calculated. A first edge index position X1 is detected on the waveform on the right side from the calculated maximum position using a first threshold TH1. Here, a signal intensity of 50% was set to the first threshold TH1, where the minimum value of signal intensity on the right side of the maximum point of signal intensity was 0% and the maximum value of signal intensity was 100%. Subsequently, a second edge index position X2 is detected on the waveform on the left side from the maximum position using a second threshold TH2. Here, a signal intensity of 50% was set to the second threshold TH2, where the minimum value of signal intensity on the left side of the maximum point of signal intensity was 0% and the maximum value of signal intensity was 100%. An average position between X1 and X2 thus detected is calculated, and the average position is considered to be an edge position Xe.

Figure 15A:
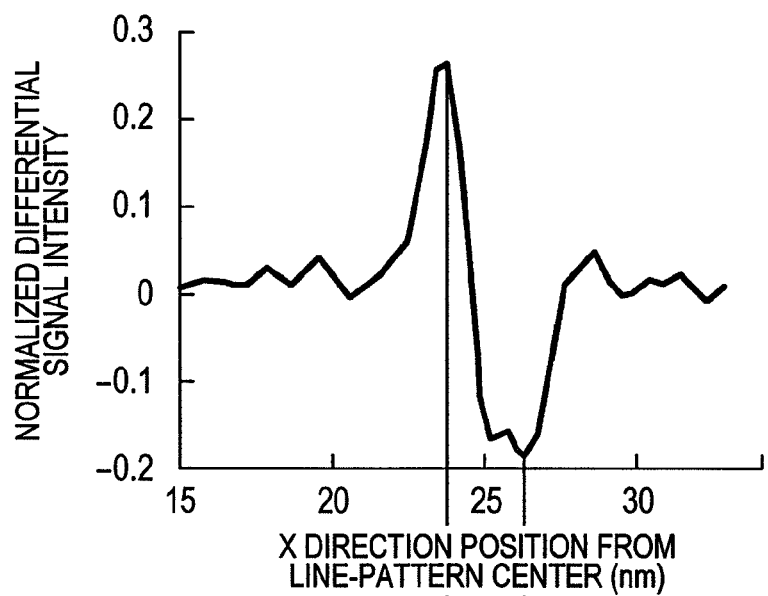
FIG. 15A is a diagram illustrating a differential signal intensity distribution.
Figure 15B:
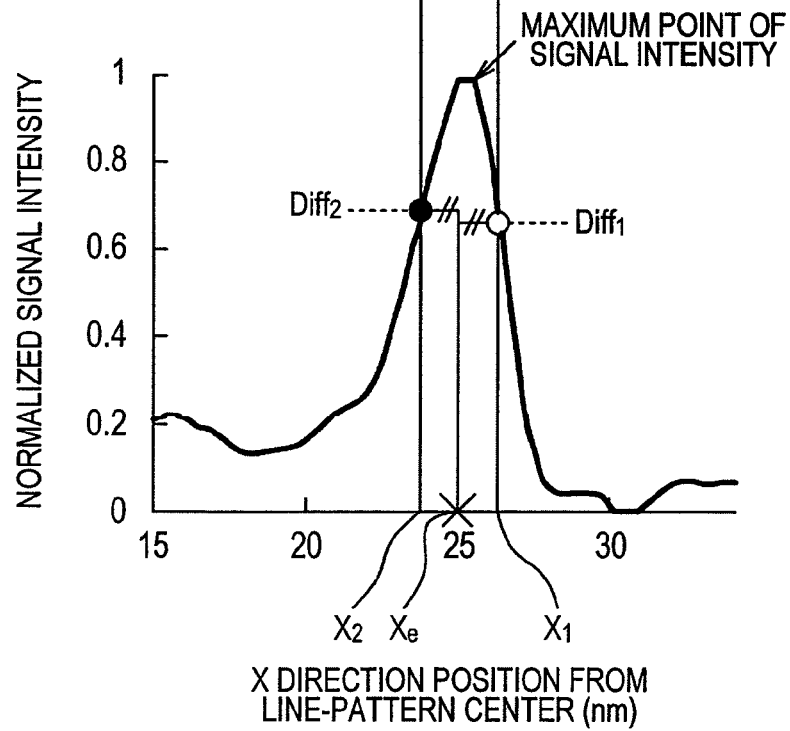
FIG. 15B is a diagram illustrating a signal intensity distribution.

The description above is an explanation in the case of selecting the threshold method for the edge detection algorithm. In the case of selecting the maximum gradient method for the edge detection algorithm will be explained with reference to FIGS. 15A and 15B. FIGS. 15A and 15B illustrate the signal intensity waveform illustrated in FIG. 9 and a differential waveform of the signal intensity waveform. In the maximum gradient method, the maximum value and minimum value of the differential waveform of the signal intensity waveform are used for edge detection. The first edge index position X1 in FIGS. 15A and 15B is defined as a position at which the differential value of the waveform on the right side takes the maximum value when seen from the maximum point of signal intensity. The second edge index position X2 in FIGS. 15A and 15B is defined as a position at which the differential value of the waveform on the left side takes the minimum value when seen from the maximum point of signal intensity. An average position between the aforementioned detected positions X1 and X2 is calculated, and the average position is considered to be the edge detection position Xe.

Figure 16:
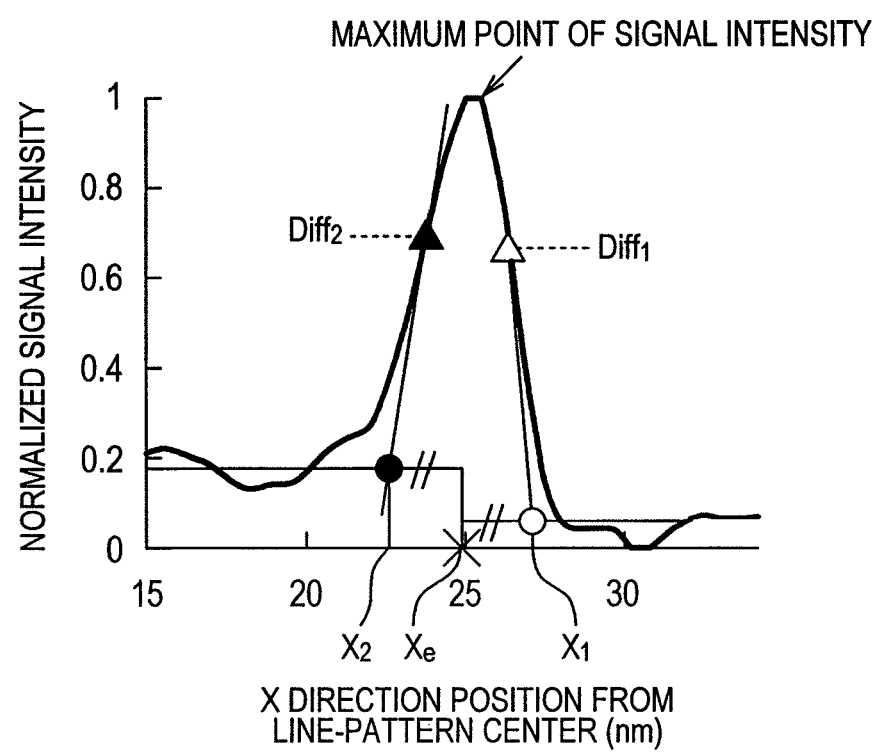
FIG. 16 is an illustration for pattern edge detection according to a straight-line approximation method.

Next, the case of selecting the straight-line approximation method for the edge detection algorithm will be explained with reference to FIG. 16. In the straight-line approximation method, the tangent of the signal intensity waveform is drawn at points $Diff_1$ and $Diff_2$ at which the differential values obtained by the maximum gradient method take the maximum. Subsequently, a straight line called a base line is drawn using the mean value at portions where signal intensity is flat. The region where the mean value is calculated in drawing this base line is specified by the user. The intersection point of the tangent and the base line described above is found on both sides of the maximum point of the signal intensity waveform for calculating the first edge index positions X1 and the second edge index position X2. An average position between X1 and X2 detected described above is calculated, and the average position is considered to be the edge detection position Xe.

The description above expresses the process of calculation in performing edge detection on the right edge of the line pattern, and edge detection is also similarly performed on the left edge. However, the directions of calculating X1 and X2 are reverse directions. Moreover, X1 and X2 obtained by various methods can be displayed on the display unit.

Figure 10:
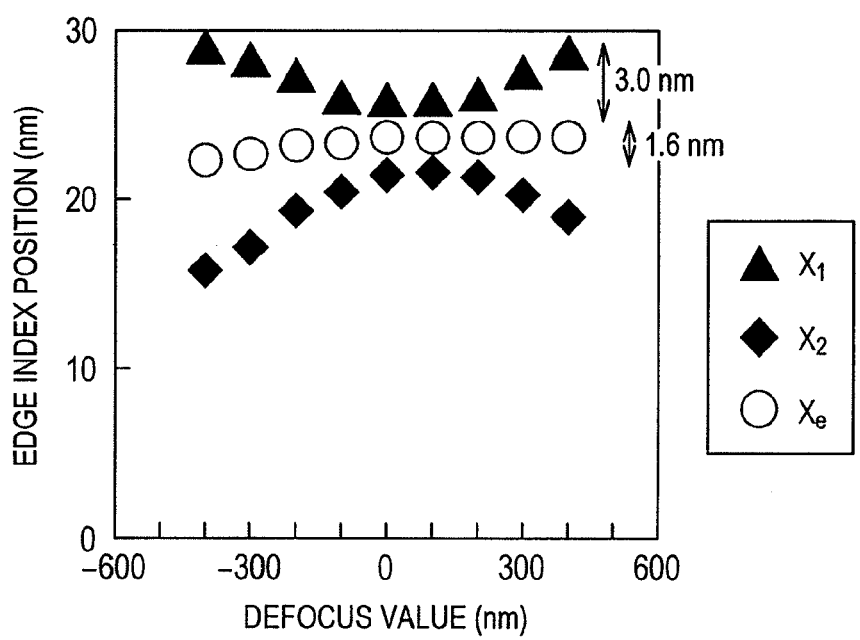
FIG. 10 is a diagram illustrating the effect of suppressing fluctuations in edge positions in the first embodiment.

The effect in the case of selecting the threshold method for the edge detection algorithm will be described. FIG. 10 illustrates results that the first edge index positions X1 and the second edge index position X2 are calculated from images of the pattern illustrated in FIG. 2 acquired while changing the focal point of the CD-SEM. Defocus is varied from −400 to 400 nm. The occurrence of defocus in a negative direction refers to underfocus, and the occurrence of defocus in a positive direction refers to overfocus. Moreover, X1 and X2 illustrated in FIG. 10 are results that are calculated using a conventional threshold method. The thresholds used here are TH1=50% and TH2=50%.

As revealed from FIG. 10, when defocus occurs, X1 becomes large, whereas X2 becomes small. This is the same tendency of a change in the signal intensity waveform illustrated in FIG. 4B.

FIG. 10 also illustrates the edge position Xe calculated from X1 and X1. Dimension fluctuations due to defocus are made smaller as compared with X1 that is a conventional measured value. Although an edge position detection error of 3.0 nm at the maximum occurs in X1 due to defocus, the error can be suppressed to 1.6 nm according to this embodiment.

The error value due to defocus could be reduced to about a half of that according to the conventional method. However, an error of 1.6 nm still occurs. It can be considered that the following is the cause of an error of 1.6 nm in this embodiment.

When X1 and X2 illustrated in FIG. 10 are studied in detail, X1 is distributed in almost bilateral symmetry as a defocus of 0 nm is at the center. On the other hand, the center position of X2 is shifted +100 nm. This is because the difference in the pattern height expressed in X1 and X2.

Figure 2:
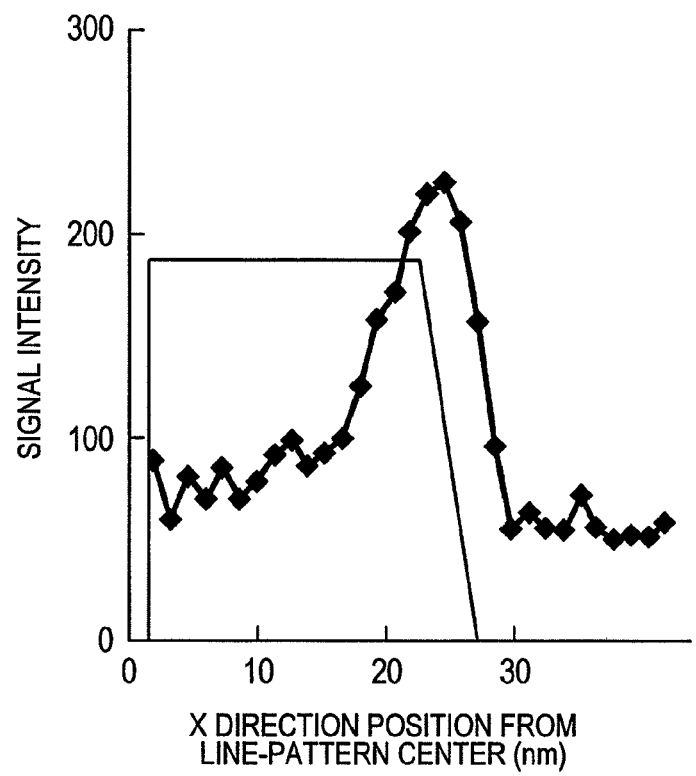
FIG. 2 is a diagram illustrating the cross sectional topology of a pattern and a signal intensity distribution including a pattern edge position.
Figure 3:
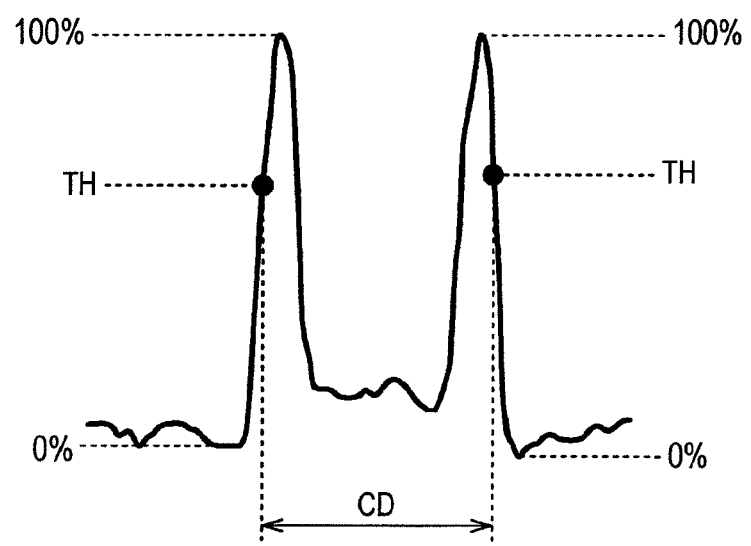
FIG. 3 is an illustration for pattern edge detection according to a threshold method.

As illustrated in FIG. 2, the right side of the maximum point of intensity of the signal intensity waveform reflects the pattern tail, and the left side of the maximum point of intensity reflects the pattern top. Namely, X1 expresses the pattern tail, and X2 expresses the pattern top. Since the pattern measured in FIG. 10 has a height of 100 nm, focus is achieved in X1 at a position in a defocus of 0 nm, whereas focus is achieved in X2 at a position in a defocus of +100 nm. Thus, a difference occurs between the extreme value positions of X1 and X2 illustrated in FIG. 10. A shift between X1 and X2 due to defocus cannot be cancelled because of this difference between the extreme value positions.

Figure 11:
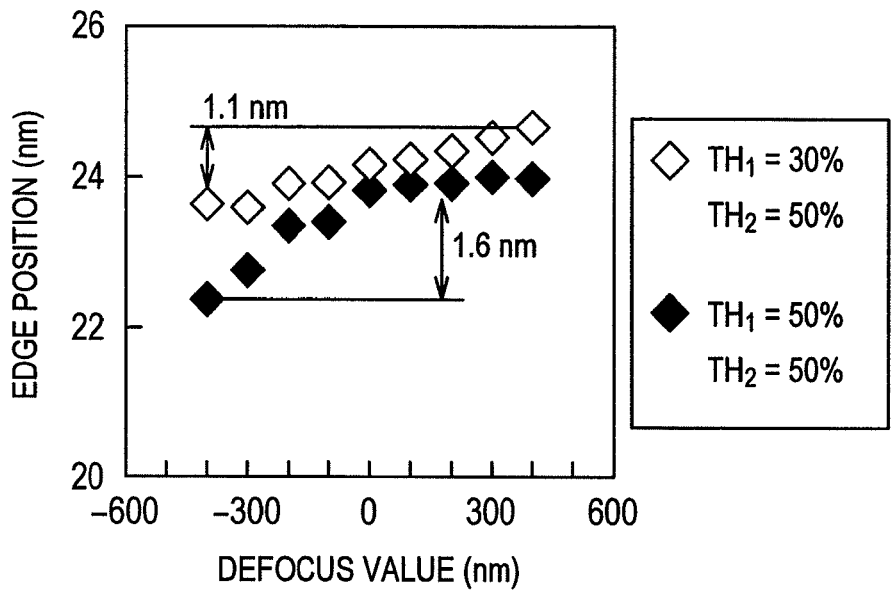
FIG. 11 is a diagram illustrating the effect when optimizing thresholds according to the first embodiment.

FIG. 10 illustrates the results that pattern dimensions are measured at TH1=50% and TH2=50%. FIG. 11 illustrates the measurement result of Xe at TH1=30% and TH2=50%. As compared with the case of TH1=50% and TH2=50%, the distribution is flatter in the case of TH1=30% and TH2=50%, and the edge position error value is reduced from 1.6 nm to 1.1 nm. Since the measured height is different between X1 and X2, it is shown that the thresholds are optimized to detect X1 and X2 at the optimum thresholds, whereby the error can be made much smaller than the case of using the same threshold for X1 and X2.

Optimizing the thresholds TH1 and TH2 used in this embodiment is effective for improving the accuracy of pattern dimension inspection when the conditions such as pattern height, the pattern side-wall angle, and the depth of focus of the electron beam are changed. Therefore, in this embodiment, TH1 and TH2 can be set individually, and optimized depending on the conditions of the measurement subject pattern and the electron beam.

Figure 12:
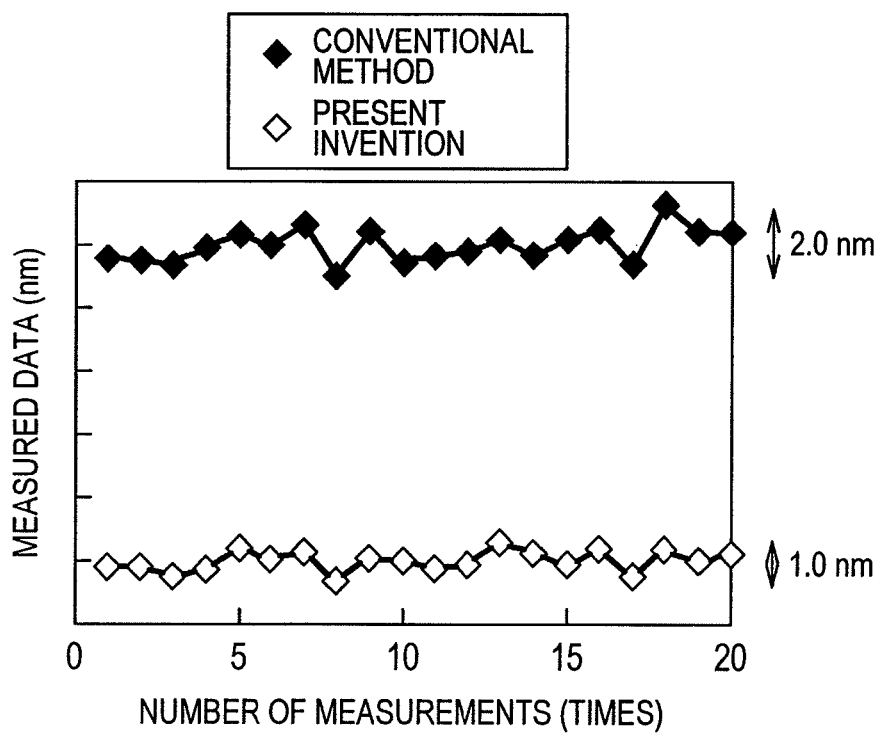
FIG. 12 is a diagram illustrating the comparison between variations in repeating measurements according to a conventional method and a method according to the first embodiment.

FIG. 12 illustrates the difference in results that the edge of a line pattern was detected using a conventional method and this embodiment for repeatedly measuring line width. FIG. 12 illustrates the results of dimension fluctuations in the case where the same pattern was repeatedly measured at 20 times. The focal point was automatically adjusted in every measurement for causing fluctuations in the focal point in every measurement. It is revealed from the results in FIG. 12 that recurring measured errors were about 2 nm in the conventional method (the threshold TH1 was used for edge detection) whereas recurring measured errors were suppressed to about 1 nm in this embodiment (corrected first and second thresholds TH1 and TH2 were used for edge detection).

In this embodiment, measured data is made smaller than that in the conventional method. This is because waveforms on both sides are used to calculate dimensions, not only one side of a waveform. In this embodiment, it is possible to set the offset value so as to cancel the difference in measured data in the conventional method. The cross sectional image of the pattern is used to appropriately set the offset value, whereby it possible to obtain the dimension value equivalent to that of the conventional method.

Subsequently, the measurement error Xf due to defocus is calculated in Step S7013. Here, in this embodiment, Xf is considered to be a difference between X1 and X2, which is not limited thereto.

In Step S7014, the set error acceptance value is compared with the measurement error Xf. Since it is likely that defocus occurs if the measurement error exceeds the acceptance value, the process again returns to Step S7006, and the focal point is adjusted for edge detection. In this processing, the display unit 10 displays a warning about defocus. If the measurement error falls in the acceptance value in Step S7014, the edge position Xe is displayed on the display unit.

Lastly, it is determined whether all the measurement points registered beforehand are measured in Step S7016. If any point is left, the process returns to Step S7003 for starting to measure the subsequent point. If all the measurement points have been measured, measurement is ended in Step S701S7.

It is noted that the method according to this embodiment can reduce measured errors even though the method is applied to one edge of a pattern to be measured. However, the method can further reduce errors by applying the method to both edges.

As described above, according to this embodiment, the first threshold and the second threshold are used for edge detection, whereby it is possible to provide a pattern dimension measurement method with a small measured error and excellent reproducibility even though defocus occurs and a critical dimension scanning electron microscope (CD-SEM) for use in the same. Moreover, the first threshold and the second threshold are set individually, whereby it is possible to obtain measurement results with high dimension accuracy. Furthermore, in the case where the side wall has a slope, the signal intensity distribution moves to the tail portion side different from the case of out of focus, so that it is possible to measure dimensions of a pattern that the side wall has a slope.

Second Embodiment

Figure 13A:
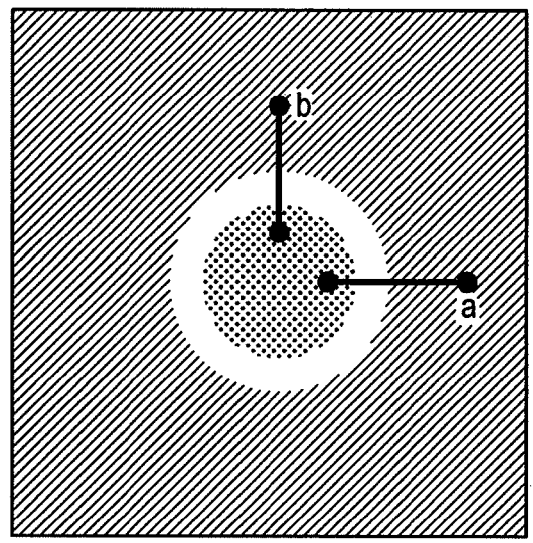
FIG. 13A is a schematic diagram illustrating an SEM image in measuring a hole pattern (unevenness in brightness is not illustrated).

A second embodiment will be described with reference to FIGS. 13A, 13B, and 14. In this embodiment, pattern dimension inspection will be described in the case where a measurement subject pattern is a hole pattern. It is noted that the description which is stated in the first embodiment and not stated in this embodiment is the same in the first embodiment.

In a semiconductor device, a hole pattern called a contact hole is formed in an insulating film in order to conduct wiring layers to each other. Since this contact hole pattern is formed in the insulating film, charge up due to the application of an electron beam becomes noticeable. For an exemplary problem in images caused by charge up, there is unevenness in brightness in the upper and lower part of a hole pattern (a schematic diagram illustrating an SEM image) as illustrated in FIG. 13A (however, the situation of unevenness is not illustrated).

Figure 13B:
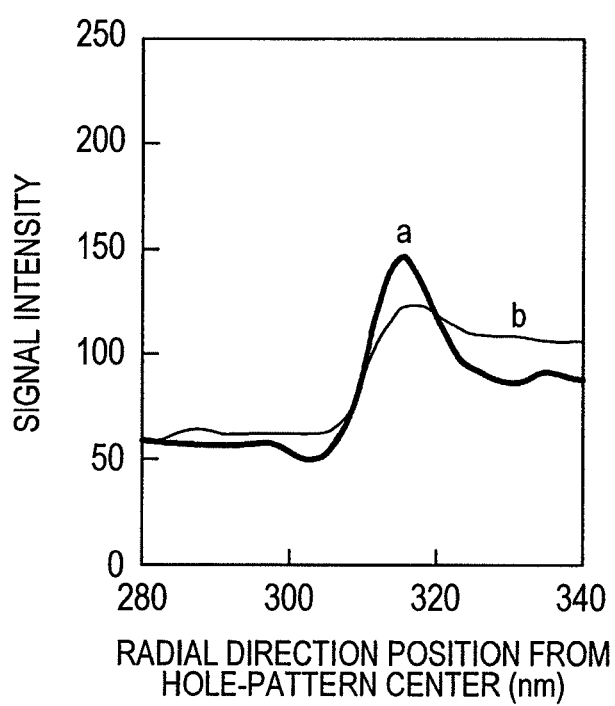
FIG. 13B is a diagram illustrating a change between signal intensity distributions (unevenness in brightness) in a radial direction in measuring a hole pattern.

FIG. 13B illustrates signal intensity distributions at positions a and b on the hole pattern. The white band peak is large in the signal intensity distribution at a, whereas the peak is small in the distribution at b. Moreover, the difference between the maximum point of signal intensity and the minimum point of signal intensity is smaller at b than at a.

It can be considered that the difference between the distributions at a and b is caused by the pattern edge and the scanning direction of the electron beam. The orientation of the pattern edge in a direction a is vertical to the scanning direction of the electron beam, whereas the orientation of the pattern edge in a direction b is parallel with the scanning direction of the electron beam.

In the case of the line pattern, the orientation of the pattern edge and the scanning direction of the electron beam are always constant, so that unevenness in brightness is not observed. Unevenness in brightness is a problem inherent in the hole pattern. In the case where unevenness in brightness occurs, the edge detection algorithm and parameters to be set are changed between a and b, whereby the influence of electrification can be reduced.

Figure 14:
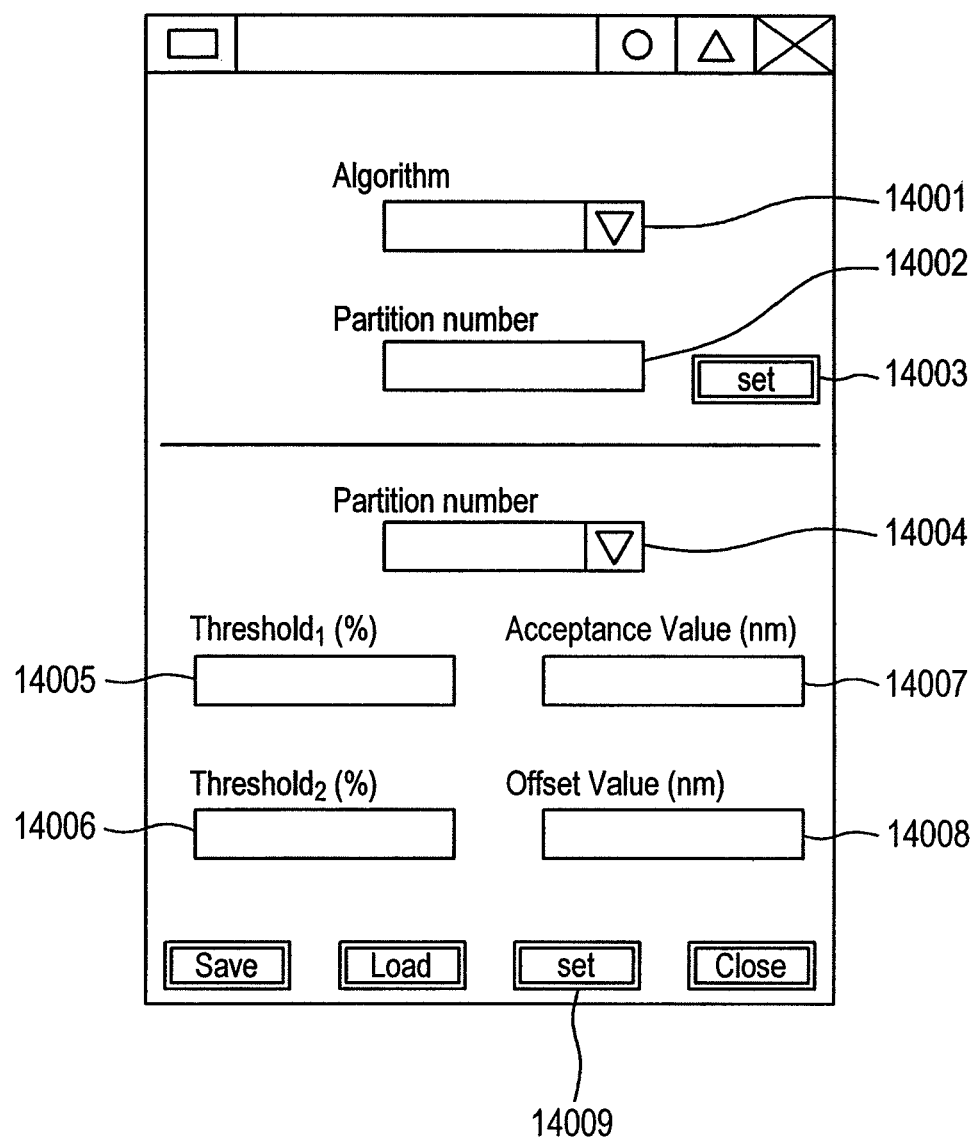
FIG. 14 is a diagram illustrating a GUI for setting parameters in measuring a hole pattern according to a second embodiment.

FIG. 14 illustrates a GUI for use in setting parameters in this embodiment. FIG. 14 illustrates the GUI when using thresholds for a critical dimension algorithm. However, the critical dimension algorithm is not limited to the threshold method. The maximum gradient method and the straight-line approximation method can also be used as similar to the first embodiment.

A reference numeral 14001 in FIG. 14 denotes an edge detection algorithm select frame. A reference numeral 14002 denotes a partition number input frame in the circumferential direction. A reference numeral 14003 denotes a setting button for the edge detection algorithm and the partition number. This setting button 14003 is pressed to set the algorithm selected at the edge detection algorithm select frame 14001 and the partition number inputted at the partition number input frame 14002 in the circumferential direction. In the case of the hole pattern, the edge is detected at a plurality of locations in the circumferential direction, the center of the pattern is found, a signal intensity waveform is calculated from the center of the hole pattern, and final edge detection is performed for use in calculating the hole diameter. The number of edges to be detected is specified at the partition number input frame 14002 in the circumferential direction.

In the case of the hole pattern, since the signal intensity waveform is varied depending on the direction of the edge as illustrated in FIG. 13B, the parameters for edge detection are made variable depending on the angle for edge detection.

A reference numeral 14004 in FIG. 14 is a select frame to select the partition number for setting parameters, and the select frame can select the partition number up to the partition number specified at the partition number input frame 14002 in the circumferential direction. The first threshold is inputted at an input frame denoted by a reference numeral 14005 for the partition number selected at the select frame 14004 to select the partition number for setting parameters, and the second threshold is inputted at an input frame denoted by a reference numeral 14006. The measurement error acceptance value is inputted at a measurement error acceptance value input frame 14007, and the edge position correction value is inputted at an edge position correction value input frame 14008.

The parameters for edge detection set in FIG. 14 are set by pressing a setting button 14009, and used for edge detection.

As described above, according to this embodiment, it is possible to obtain the similar effect as that in the first embodiment. Moreover, the partition number in the circumferential direction is set, whereby it is possible to accurately measure the dimensions of a hole pattern.

Third Embodiment

In the following, a third embodiment will be described. In this embodiment, inspection will be described in the case where a measurement subject pattern is a complicated pattern. It is noted that the description, which is stated in the first or second embodiment and not stated in this embodiment, is the same as the description in the first or second embodiment.

Other than simple patterns such as a line pattern and a hole pattern described above, there is increasing need for inspecting more complicated pattern shapes as in OPC (Optical Proximity Correction) check and hot spot inspection.

A pattern outline was generated from a pattern edge detected according to this embodiment, and design data was compared between this outline and a semiconductor device, whereby complicated patterns could be inspected. Thus, it was revealed that this embodiment is effective also for the aforementioned complicated pattern inspection.

In this inspection, desirably, thresholds are optimized depending on the orientation of the edge as similar to optimizing parameters at every angle described in the second embodiment. However, the pattern to be inspected in this embodiment does not have the center position like the hole pattern, so that edge directions to extract outlines have to be found individually. Local gradients can be used for calculating edge directions. However, a method for calculating edge directions is not limited thereto.

Edge detection is performed using parameter settings corresponding to the edge direction found from the local gradient, whereby it is made possible to highly accurately inspect two-dimensional shapes.

As described above, according to this embodiment, it is possible to obtain the similar effect as that in the first embodiment. Moreover, it is possible to highly accurately measure the dimensions of even complicated patterns for OPC.

Forth Embodiment

In the following, a fourth embodiment will be described. In this embodiment, an example will be described in which an ion microscope is used instead of the scanning electron microscope. It is noted that the descriptions that are stated in any of the first to third embodiments and not stated in this embodiment are the same as in the first to third embodiments.

The similar effect can also be expected when using the ion microscope for measuring pattern dimensions described in the first to third embodiments.

The ion microscope is used to obtain images of higher resolution than images obtained by the CD-SEM using an electron beam. However, since neutral gas is ionized for obtaining ions in the ion microscope, vibrations in the apparatus caused by a mechanism to introduce neutral gas become large. It is thought that the edge portion of the image obtained by the ion microscope tends to blur because of a strong influence of the vibrations, so that edge detections described in the first to third embodiments are effective.

As described above, according to this embodiment, the first threshold and the second threshold are used for edge detection, whereby it is possible to provide a pattern dimension measurement method with a small measured error and excellent reproducibility even though defocus occurs and an ion microscope for use in the same. Moreover, it is possible to reduce a blur in the edge portion of an image, which is a problem inherent in the ion microscope, while keeping high resolution, and to highly accurately measure dimensions.

REFERENCE SIGNS LIST

1 Electron optical system
2 Electron source
3 Converging lens
4 Deflector
5 Objective lens
6 Stage
7 Wafer for measurement subject
8 Detector
10 Display unit
11 Storage unit
12 Flow to save data
13 Flow to load data
100 Operating unit
101 Signal intensity maximum point calculating unit
102 Edge index position calculating unit
103 Edge position calculating unit
104 Threshold setting unit
105 Defocus value calculating unit
106 Edge position correction operating unit
107 Hole pattern signal intensity distribution calculating unit
8001 Select frame for edge detection algorithms registered beforehand
8002 First threshold input frame
8003 Second threshold input frame
8004 Measurement error acceptance value input frame
8005 Edge position correction value input frame
8006 Parameter save button
8007 Parameter load button
8008 Parameter setting button
14001 Select frame for edge detection algorithms
14002 Partition number input frame in the circumferential direction
14003 Setting button for the edge detection algorithm and the partition number
14004 Select frame for the partition number for setting parameters
14005 First threshold input frame
14006 Second threshold input frame
14007 Measurement error acceptance value input frame
14008 Edge position correction value input frame
14009 Parameter setting button

The invention claimed is:

1. A pattern dimension measurement method for applying a charged particle beam to a specimen formed with a pattern to measure a pattern dimension from a signal intensity distribution of backscattered charged particles or secondary charged particles generated from the specimen, the method comprising:
calculating a first maximum point of intensity of a waveform at which the signal intensity becomes a maximum intensity at a location corresponding to a first edge of a pattern to be measured;
calculating a first edge index position A based on a first threshold, the first edge index position A located to the right of the first maximum point of intensity on the waveform;
calculating a first edge index position B based on a second threshold set independently from the first threshold, the first edge index position B located to the left of the first maximum point of intensity on the waveform; and
calculating a first edge position of the pattern to be measured based on the first edge index position A and the first edge index position B.

2. The pattern dimension measurement method according to claim 1, comprising:
   calculating a second maximum point of intensity of the waveform at a location corresponding to a second edge of the pattern to be measured;
   calculating a second edge index position A based on a third threshold, the second edge index position A located to the left of the second maximum point of intensity on the waveform;
   calculating a second edge index position B based on a fourth threshold set independently from the third threshold, the second edge index position B located to the right of the second maximum point of intensity on the waveform;
   calculating a second edge position of the pattern to be measured based on the second edge index position A and the second edge index position B; and
   calculating a dimension of the pattern to be measured using the first edge position and the second edge position.

3. The pattern dimension measurement method according to claim 1, further comprising independently setting a signal intensity to be a reference to the first and second thresholds.

4. The pattern dimension measurement method according to claim 1, further comprising:
   setting a measurement error acceptance value;
   calculating a difference between the first edge index position A and the first edge index position B as a measurement error due to defocus; and
   determining an error when the measurement error exceeds the measurement error acceptance value.

5. The pattern dimension measurement method according to claim 1, further comprising:
   finding a signal intensity distribution from a center of a hole pattern to a plurality of angular directions when a measurement subject is a hole pattern; and
   setting a different edge detection algorithm according to an angle in finding the signal intensity distribution.

6. The pattern dimension measurement method according to claim 1, comprising:
   inputting an edge position correction value for the first pattern edge position; and
   correcting the first pattern edge position according to the edge position correction value.

7. A charged particle beam microscope comprising:
   a charged particle optical system including:
      a stage; and
      a detector configured to apply a charged particle beam to an observation region of a specimen placed on the stage while scanning the charged particle beam, and detect signal charged particles including backscattered charged particles or secondary charged particles generated from the specimen;
   an operating unit including:
      a unit configured to acquire a two-dimensional image of a pattern to be a dimension measurement subject placed in the observation region using information about a waveform of signal intensity of the signal charged particles detected at the detector; and
      a unit configured to measure a dimension of the pattern in the observation region by detecting an edge position of the pattern using the two-dimensional image; and
   a display unit,
   wherein the operating unit includes:
      a first functionality to calculate a first maximum point of intensity of a waveform at which the signal intensity becomes a maximum intensity at a location corresponding to a first edge of a pattern to be measured;
      a second functionality to calculate a first edge index position A based on a first threshold, the first edge index position A located to the right of the first maximum point of intensity on the waveform, and to calculate a first edge index position B based on a second threshold set independently from the first threshold, the first edge index position B located to the left of the first maximum point of intensity on the waveform; and
      a third functionality to calculate a first edge position of the pattern to be measured based on the first edge index position A and the first edge index position B; and
   wherein the display unit displays a result of calculating the first edge position.

8. The charged particle beam microscope according to claim 7, wherein:
   the display unit includes a GUI screen to input a plurality of thresholds, and displays the edge index positions for the plurality of thresholds calculated;
   the second functionality of the operating unit calculates the edge index positions based on the plurality of thresholds;
   the charged particle beam microscope further comprises a storage unit configured to store the plurality of thresholds inputted through the GUI screen.

9. The charged particle beam microscope according to claim 8, wherein:
   the operating unit includes a fourth functionality to set the plurality of thresholds; and
   the fourth functionality independently sets a signal intensity to be a reference to the plurality of thresholds.

10. The charged particle beam microscope according to claim 7, wherein the display unit includes a GUI screen to input a measurement error acceptance value.

11. The charged particle beam microscope according to claim 10, wherein the operating unit includes a fifth functionality to calculate a difference between the first edge index position A and the first edge index position B as a first measurement error due to defocus.

12. The charged particle beam microscope according to claim 7, wherein:
   the operating unit includes a sixth functionality to calculate a signal intensity distribution from a center of a hole pattern to a plurality of angular directions when a measurement subject is a hole pattern; and
   the display unit includes a GUI screen to input a different edge detection algorithm according to an angle in finding the signal intensity distribution.

13. The charged particle beam microscope according to claim 7, wherein:
   the display unit includes a GUI screen to input an edge position correction value, and displays an edge position corrected using the edge position correction value as a pattern edge position;
   the operating unit includes a seventh functionality to add the edge position correction value to the pattern edge positions; and
   the charged particle beam microscope further comprises a storage unit configured to store the inputted edge position correction value.

14. A pattern dimension measurement method for applying a charged particle beam to a specimen formed with a pattern to measure a pattern dimension from a signal intensity distribution of backscattered charged particles or secondary charged particles generated from the specimen, the method comprising:
   calculating a first maximum point of intensity of a waveform at which the signal intensity becomes a maximum intensity at a location corresponding to a first edge of a pattern to be measured;

calculating a first edge index position A based on a first mean signal intensity and a first differential signal intensity, the first edge index position A located to the right of the first maximum point of intensity on the waveform;

calculating a first edge index position B based on a second mean signal intensity and a second differential signal intensity, the first edge index position B located to the left of the first maximum point of intensity on the waveform; and calculating a first edge position of the pattern to be measured based on the first edge index position A and the first edge index position B.

15. The pattern dimension measurement method according to claim 14, further comprising:

setting a measurement error acceptance value;

calculating a difference between the first edge index position A and the first edge index position B as a measurement error due to defocus; and determining an error when the measurement error exceeds the measurement error acceptance value.

16. The pattern dimension measurement method according to claim 14, further comprising:

finding a signal intensity distribution from a center of a hole pattern to a plurality of angular directions when a measurement subject is a hole pattern; and setting a different edge detection algorithm according to an angle in finding the signal intensity distribution.

17. The pattern dimension measurement method according to claim 14, comprising:

inputting an edge position correction value for the first pattern edge position; and correcting the first pattern edge position according to the edge position correction value.

18. A charged particle beam microscope comprising:

a charged particle optical system including:

a stage; and a detector configured to apply a charged particle beam to an observation region of a specimen placed on the stage while scanning the charged particle beam, and detect signal charged particles including backscattered charged particles or secondary charged particles generated from the specimen;

an operating unit including:

a unit configured to acquire a two-dimensional image of a pattern to be a dimension measurement subject placed in the observation region using information about a waveform of signal intensity of the signal charged particles detected at the detector; and a unit configured to measure a dimension of the pattern in the observation region by detecting an edge position of the pattern using the two-dimensional image; and a display unit, wherein the operating unit includes:

a first functionality to calculate a first maximum point of intensity of a waveform at which the signal intensity becomes a maximum intensity at a location corresponding to a first edge of a pattern to be measured;

a second functionality to calculate a first edge index position A based on a first mean signal intensity and a first differential signal intensity, the first edge index position A located to the right of the first maximum point of intensity on the waveform, and to calculate a first edge index position B based on a second mean signal intensity and a second differential signal intensity, the first edge index position B located to the left of the first maximum point of intensity on the waveform; and a third functionality to calculate a first edge position of the pattern to be measured based on the first edge index position A and the first edge index position B; and wherein the display unit displays a result of calculating the first edge position.

19. The charged particle beam microscope according to claim 18, wherein the display unit includes a GUI screen to input a measurement error acceptance value.

20. The charged particle beam microscope according to claim 19, wherein the operating unit includes a fifth functionality to calculate a difference between the first edge index position A and the first edge index position B as a first measurement error due to defocus.

21. The charged particle beam microscope according to claim 18, wherein:

the operating unit includes a sixth functionality to calculate a signal intensity distribution from a center of a hole pattern to a plurality of angular directions when a measurement subject is a hole pattern; and the display unit includes a GUI screen to input a different edge detection algorithm according to an angle in finding the signal intensity distribution.

22. The charged particle beam microscope according to claim 18, wherein:

the display unit includes a GUI screen to input an edge position correction value, and displays an edge position corrected using the edge position correction value as a pattern edge position;

the operating unit includes a seventh functionality to add the edge position correction value to the pattern edge positions; and the charged particle beam microscope further comprises a storage unit configured to store the inputted edge position correction value.

* * * * *